US012757732B2

(12) United States Patent
Guda Vishnu et al.

(10) Patent No.: US 12,757,732 B2
(45) Date of Patent: Oct. 6, 2026

(54) BONDING LAYERS FORMED OF HIGH THERMAL CONDUCTIVITY MATERIALS

(71) Applicant: Applied Materials, Inc., Santa Clara, CA (US)

(72) Inventors: Karthik Guda Vishnu, Milpitas, CA (US); Liu Jiang, Dublin, CA (US); El Mehdi Bazizi, San Jose, CA (US); Siddarth Krishnan, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 420 days.

(21) Appl. No.: 18/437,322

(22) Filed: Feb. 9, 2024

(65) Prior Publication Data

US 2025/0259958 A1 Aug. 14, 2025

(51) Int. Cl.

| | |
|---|---|
| ***H10W 40/25*** | (2026.01) |
| ***H10W 20/20*** | (2026.01) |
| ***H10W 72/30*** | (2026.01) |
| ***H10W 90/00*** | (2026.01) |

(52) U.S. Cl.

CPC .......... *H10W 40/259* (2026.01); *H10W 20/20* (2026.01); *H10W 72/321* (2026.01); *H10W 72/353* (2026.01); *H10W 90/734* (2026.01)

(58) Field of Classification Search

CPC . H10W 40/259; H10W 20/20; H10W 72/321; H10W 72/353; H10W 90/734; H10W 20/427

See application file for complete search history.

(56) References Cited

U.S. PATENT DOCUMENTS

| | | | | |
|---|---|---|---|---|
| 5,096,740 | A | 3/1992 | Nakagama et al. | |
| 5,227,318 | A | 7/1993 | Doll et al. | |
| 5,398,639 | A | 3/1995 | Doll et al. | |
| 5,535,905 | A | 7/1996 | Harris et al. | |
| 5,597,625 | A | 1/1997 | Ong et al. | |
| 8,115,302 | B2 | 2/2012 | Andry et al. | |
| 10,224,310 | B2 | 3/2019 | Liu | |
| 11,183,487 | B2 | 11/2021 | Lai et al. | |
| 11,271,567 | B1 | 3/2022 | Chen et al. | |
| 11,581,281 | B2 | 2/2023 | Yu et al. | |
| 2016/0322331 | A1* | 11/2016 | Lim | H10D 88/00 |

(Continued)

OTHER PUBLICATIONS

PCT International Search Report and Written Opinion for PCT/US2024/062008 dated Apr. 21, 2025.

*Primary Examiner* — Mark W Tornow
(74) *Attorney, Agent, or Firm* — Moser Taboada

(57) ABSTRACT

A method for forming a structure with a backside power delivery network incorporates a high thermal conductivity material as the bonding layer. In some embodiments, the method may comprise forming a first layer stack that includes a front side metallization (FSM) signal layer formed on a silicon die layer containing nano-through silicon vias (n-TSVs) that is formed on a back side metallization (BSM) power distribution layer where the n-TSVs provide back side power connections to the FSM signal layer, forming a second layer stack that includes a silicon carrier layer, and forming a third layer stack that includes the first layer stack and the second layer stack bonded together with a bonding layer interposed between the first layer stack and the second layer stack where the bonding layer is formed of a cubic-boron nitride-based material.

20 Claims, 2 Drawing Sheets

(56) References Cited

U.S. PATENT DOCUMENTS

| | | | | |
|---|---|---|---|---|
| 2018/0130744 | A1* | 5/2018 | Chen | H10H 20/01335 |
| 2020/0303361 | A1* | 9/2020 | Shih | H10D 84/038 |
| 2021/0407942 | A1* | 12/2021 | Yu | H10W 20/0245 |
| 2023/0230901 | A1 | 7/2023 | Farooq et al. | |
| 2023/0307384 | A1* | 9/2023 | Chang | H10W 42/00 |
| 2023/0402381 | A1 | 12/2023 | Lanzillo et al. | |
| 2024/0128150 | A1 | 4/2024 | Tong et al. | |
| 2024/0234318 | A9* | 7/2024 | Joshi | H10D 84/0149 |

* cited by examiner

BONDING LAYERS FORMED OF HIGH THERMAL CONDUCTIVITY MATERIALS

FIELD

Embodiments of the present principles generally relate to processing of semiconductor substrates.

BACKGROUND

Power delivery networks (PDN) provide power to active devices on dies. The PDN is a network of interconnects that is separate from a signal network. In traditional manufacturing, the networks are fabricated through back-end-of-line (BEOL) processes that form the networks on the front side of a wafer. The front side formation causes the PDN to compete with the signal networks for space, resulting in very congested routing of the networks. The inventors have observed, however, that if the PDN is moved to the back side of the wafer, congestion is reduced but heat dissipation becomes problematic.

Accordingly, the inventors have provided methods for improving thermal performance for backside power delivery networks.

SUMMARY

Methods for improving the thermal performance of bonding layers used with backside power delivery networks are provided herein.

In some embodiments, a method for forming a structure with a backside power delivery network (BS-PDN) may comprise forming a first layer stack that includes, at least, a front side metallization (FSM) signal layer formed on a silicon die layer containing nano-through silicon vias (n-TSVs) that is formed on a back side metallization (BSM) power distribution layer where the n-TSVs provide back side power connections to the FSM signal layer, forming a second layer stack that includes, at least, a silicon carrier layer, and forming a third layer stack that includes the first layer stack and the second layer stack bonded together with a bonding layer interposed between the first layer stack and the second layer stack where the bonding layer is formed of a cubic-boron nitride-based material.

In some embodiments, the method further includes a cubic-boron nitride-based material that is a cubic-boron nitride material enriched with B-10 or B-11 isotopes using a process to obtain a B-10 or B-11 isotope percentage of approximately 99%, a silicon die layer has a thickness of approximately 200 nm to approximately 300 nm, n-TSVs that have a diameter of approximately 100 nm, a bonding layer that has a thickness of approximately 250 nm to approximately 1.2 microns, a bonding layer that has a thickness of approximately 1.0 micron, a second layer stack that includes a thermal interface material (TIM) layer formed on the silicon carrier layer and a heat sink layer formed on the TIM layer, a heat sink layer that is formed of copper, a first layer stack that is a device wafer, and/or a first layer stack that further includes the BSM layer formed on a controlled collapse of chip connection (C4) layer and the C4 layer formed on a substrate.

In some embodiments, a method for forming a structure with a backside power delivery network may comprise forming a first layer stack that includes, at least, a front side metallization (FSM) signal layer formed on a silicon die layer containing nano-through silicon vias (n-TSVs) that is formed on a back side metallization (BSM) power distribution layer where the n-TSVs provide back side power connections to the FSM signal layer and have a diameter of approximately 100 nm, forming a second layer stack that includes, at least, a silicon carrier layer, and forming a third layer stack that includes the first layer stack and the second layer stack bonded together with a bonding layer interposed between the first layer stack and the second layer stack where the bonding layer is formed of a cubic-boron nitride-based material and has a thickness of approximately 250 nm to approximately 1.2 microns.

In some embodiments, the method further includes a cubic-boron nitride-based material that is a cubic-boron nitride material enriched with B-10 or B-11 isotopes using a process to obtain a B-10 or B-11 isotope percentage of approximately 99%, a silicon die layer has a thickness of approximately 200 nm to approximately 300 nm, a bonding layer that has a thickness of approximately 1.0 micron, a second layer stack that includes a thermal interface material (TIM) layer formed on the silicon carrier layer and a heat sink layer formed on the TIM layer, a heat sink layer that is formed of copper, a first layer stack that is a device wafer, and/or a first layer stack that further includes the BSM layer formed on a controlled collapse of chip connection (C4) layer and the C4 layer formed on a substrate.

In some embodiments, a non-transitory, computer readable medium having instructions stored thereon that, when executed, cause a method for forming a structure with a backside power delivery network to be performed, the method may comprise forming a first layer stack that includes, at least, a front side metallization (FSM) signal layer formed on a silicon die layer containing nano-through silicon vias (n-TSVs) that is formed on a back side metallization (BSM) power distribution layer where the n-TSVs provide back side power connections to the FSM signal layer, forming a second layer stack that includes, at least, a silicon carrier layer, and forming a third layer stack that includes the first layer stack and the second layer stack bonded together with a bonding layer interposed between the first layer stack and the second layer stack where the bonding layer is formed of a cubic-boron nitride-based material.

In some embodiments, the method of the non-transitory, computer readable medium having instructions thereon may further include a cubic-boron nitride-based material that is a cubic-boron nitride material enriched with B-10 or B-11 isotopes using a process to obtain a B-10 or B-11 isotope percentage of approximately 99%, a silicon die layer that has a thickness of approximately 200 nm to approximately 300 nm, n-TSVs that have a diameter of approximately 100 nm, a bonding layer that has a thickness of approximately 250 nm to approximately 1.2 microns, and/or a bonding layer has a thickness of approximately 1.0 micron.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
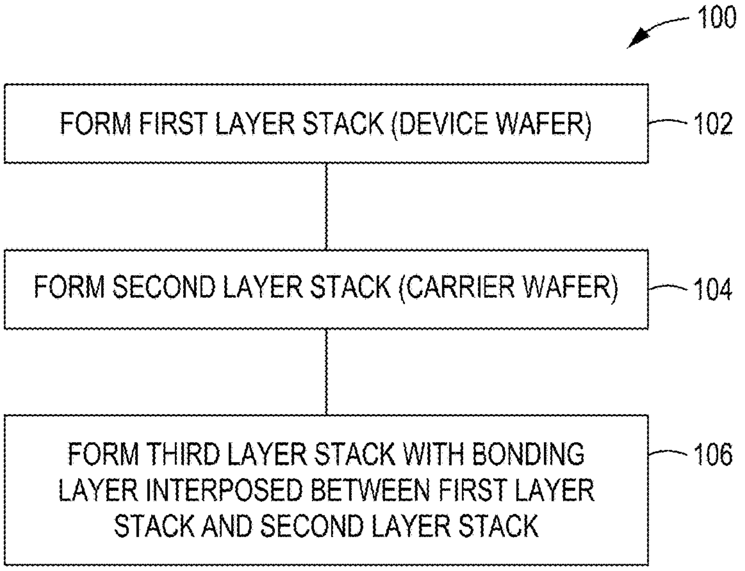
FIG. 1 is a method for forming a structure with a backside power delivery network (BS-PDN) in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide improved thermal performance of bonding layers used in structures with a backside power delivery network (BS-PDN) to increase heat transfer out of semiconductor packages. The techniques offer excellent pathways for BS-PDN thermal management by using bonding layers with enhanced thermal conductivity that increases thermal dissipation by up to 10% over traditional oxide bonding layers. In addition, the materials used in the present methods may have a reduced hardness compared to other bonding materials. The reduced hardness may enable easier processing of the materials thereby reducing manufacturing time and costs. Heat dissipation strategies such as engineering thermal interface materials (TIM), heat sink design, and adopting advanced cooling technologies add substantially to the manufacturing costs. The use of high thermal conductivity materials, in a layer that is part of the device structure, such as the bonding layer, improves the heat dissipation in BS-PDN packages without substantially increasing the raw material costs or substantially impacting the manufacturing processes.

Backside power delivery networks require extreme thinning of silicon dies for nano-through silicon via (n-TSV) integration as well as parasitic RC reduction. The extreme thinning of the silicon dies helps to resolve some n-TSV integration challenges but negatively impacts the thermal performance of the BS-PDN packages in comparison to the conventional frontside PDN (FS-PDN) packages. In the present methods, high thermal conductivity materials are used for the bonding layer to further improve the thermal performance of BS-PDN packages. In some embodiments, cubic-boron nitride (c-BN) and isotope enriched c-BN are used as the bonding layer materials. Cubic-BN has a thermal conductivity of approximately 768 W/m*K while the thermal conductivity of isotope enriched c-BN is approximately 1600 W/m*K. The use of c-BN and isotope enriched c-BN materials in lieu of conventional oxide materials allows up to an approximately 9.5% improvement in thermal performance in BS-PDN packages. The improvement in thermal performance is directly related to the high thermal conductivities of c-BN and isotope enriched c-BN which are at least approximately 540 times and approximately 1140 times the conventional oxide material thermal conductivity, respectively. Both c-BN and isotope enriched c-BN belong to the family of refractory compounds and isotope enriched c-BN is c-BN material which is enriched with c-BN's heavier isotopes (B-10 or B-11).

Power delivery networks help to provide power and reference voltage to the active devices on the die in the most efficient manner. The PDN is a network of interconnects that is separate from the network of interconnects for the signal network of the die. Traditionally, both networks are fabricated through back-end-of-line (BEOL) processing on the front side of the wafer. The PDN thus competes for space with the signal network. Having both networks occupy the same space results in routing congestion. Moving the power distribution to the back side of the wafer can help to alleviate the routing congestion. A BS-PDN package has advantages over FS-PDN packages as the BS-PDN allows direct power delivery to the standard cells, enhances system performance, increases chip area utilization, improves power integrity, and reduces the fine metal pitch BEOL complexity. The BS-PDN combines three-dimensional TSV technology and logic technology to decouple the power grid from the chip design budget and deliver power from the back side of a thinned device wafer.

The TSVs that connect the back side metallization (BSM) to the backside power rail (BPR) (backside power rail) are called n-TSVs as the via diameter sizes are on the order of approximately 100 nm. As high aspect ratio n-TSVs are undesirable for etching and filling operations, the device wafer needs to be thinned to a few hundred nanometers. Extreme thinning of the silicon dies helps to resolve n-TSV integration challenges but negatively impacts the thermal performance of the BS-PDN packages relative to the conventional FS-PDN packages. Deterioration in thermal performance in BS-PDN packages is caused predominantly by three factors. Namely, the lack of lateral heat dissipation due to the extreme thinning of the silicon die, reduction in thermal conductivity of silicon from silicon's bulk value at very small thicknesses due to increased phonon scattering, and the need for the heat to pass through the low thermal conductivity bonding layer in the BS-PDN package before reaching the heat sink on the front side.

In FIG. 1, a method 100 for forming a structure with a backside power delivery network is depicted. References to FIG. 2 will be made while discussing the method 100. In block 102, a first layer stack 224 is formed as depicted in views 200A and 200B of FIG. 2. The first layer stack 224 may be referred to as the device wafer or silicon device wafer in some instances. The first layer stack 224 includes a back side metallization (BSM) layer 206, a front side metallization (FSM) layer 210, and a thin silicon die layer 208 that contains n-TSVs 222 that traverse through the thin silicon die layer 208 from the BSM layer 206 to the FSM layer 210 to deliver power from the back side of the first layer stack 224 to the FSM layer 210. The BSM layer 206 distributes power for the BS-PDN. The FSM layer 210 distributes signals and receives power from the BS-PDN through the n-TSVs 222 to a power distribution network 220 in the FSM layer 210. In some embodiments, the thin silicon die layer 208 may have a thickness 230 of approximately 200 nm to approximately 300 nm. In some embodiments, the n-TSVs may have a diameter of approximately 100 nm. The thickness 230 of the thin silicon die layer 208 is critical to ensure that the aspect ratio of the n-TSVs is manageable to prevent deposition and/or etch problems which would impact yield. In some embodiments, the first layer stack 224 may also include a controlled collapse of chip connection (C4) layer 204 or other type of high-level power connection layer and a substrate 202.

Figure 2:
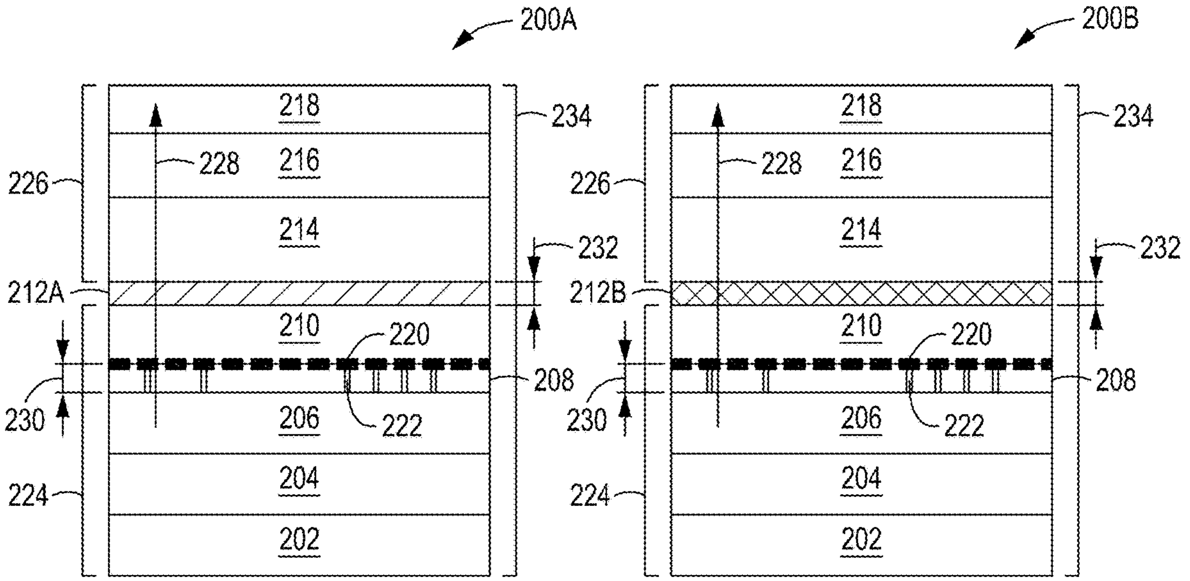
FIG. 2 depicts cross-sectional views of BS-PDN structures in accordance with some embodiments of the present principles.

In block 104, a second layer stack 226 is formed as depicted in views 200A and 200B of FIG. 2. The second layer stack 226 may be referred to as the carrier wafer in some instances. The second layer stack 226 includes a silicon carrier layer 214. In some embodiments, the second layer stack 226 may also include a thermal interface (TIM) layer 216 and/or a heat sink layer 218 to further assist in thermal dissipation. The heat generated by the BS-PDN of the first layer stack 224 must be dissipated 228 through the second layer stack 226 as the BS-PDN is on the bottom of a completed structure. In block 106, a third layer stack 234 is formed by bonding the first layer stack 224 and the second layer stack 226 together using a bonding layer 212A, 212B interposed between the first layer stack 224 and the second layer stack 226. In the view 200A of FIG. 2, the third layer stack 234 is formed using a bonding material of c-BN to form bonding layer 212A. In the view 200B of FIG. 2, the third layer stack 234 is formed using a bonding material of isotope enriched c-BN to form bonding layer 212B. The bonding layer 212A, 212B assists in dissipating the thermal load produced by the BS-PDN in the first layer stack 224 into the second layer stack 226 (e.g., into the silicon carrier layer 214, the TIM layer 216, and the heat sink layer 218 and beyond). A bonding layer 212A, 212B of c-BN-based material exhibits a higher thermal dissipation rate than that of traditionally used oxide materials such as amorphous silicon dioxide allowing the third layer stack 234 to achieve an overall dissipation improvement of approximately 10% over traditional materials.

The inventors have found that the thermal resistance of a BS-PDN package with a bonding layer of conventional oxide increases by approximately 20% over an FS-PDN package, resulting in poor package thermal performance, negatively impacting the advantages of the BS-PDN package over the FS-PDN package. The inventors discovered that the BS-PDN package thermal resistance could be improved by using a c-BN-based material instead of conventional oxide for the bonding layer. Cubic-BN is a unique material due to a combination of unique properties that c-BN inherently possesses such as an extremely high thermal conductivity, a wide band gap (Eg=6.2-6.4 eV), a low dielectric constant (~7.1), and a high breakdown field (~8 MV/cm). Cubic-BN has excellent high temperature stability, oxidation, and wear resistance. The inventors found that by taking advantage of the almost diamond-like high thermal conductivity of c-BN and isotope enriched c-BN thin films in the bonding layer that the thermal dissipation of BS-PDN packages can be improved. In some embodiments, the thickness 232 of the bonding layer 212A, 212B is approximately 250 nm to approximately 1.2 micrometers. In some embodiments, the thickness 232 of the bonding layer 212A, 212B is approximately 1.0 micrometers. If the bonding layer is too thick, chemical mechanical planarization becomes difficult when the hardness of the bonding layer is high. In addition, thinner bonding layers will transfer more heat in a given amount of time than thicker bonding layers.

Figure 3:
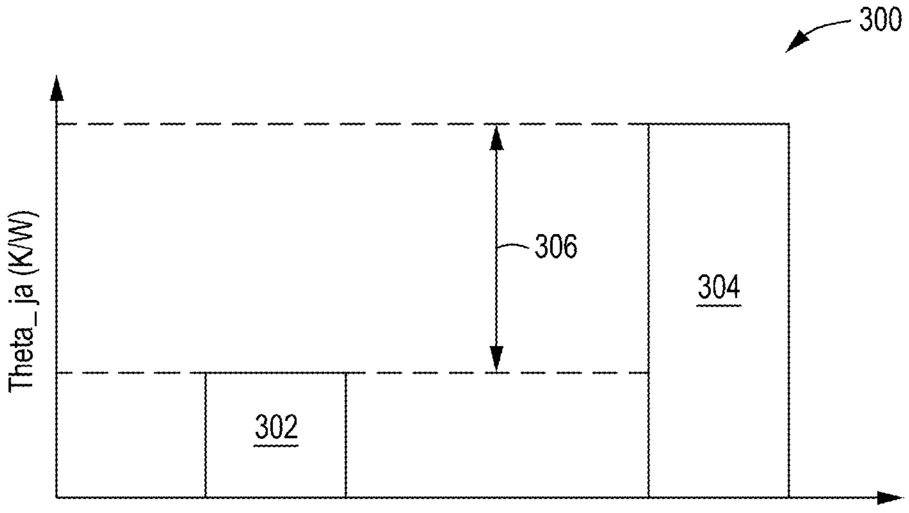
FIG. 3 depicts a graph of thermal resistance comparisons between a frontside power delivery network (FS-PDN) structure and a BS-PDN structure in accordance with some embodiments of the present principles.

By using c-BN and isotope enriched c-BN as a bonding layer material, the BS-PDN thermal package performance can be improved by as much as approximately 10% (e.g., approximately 9.5% for isotope enriched c-BN) and bring the junction of the device wafer and the carrier wafer to an ambient thermal resistance value closer to that of a FS-PDN package. In FIG. 3, a graph 300 depicts the thermal resistance of an FS-PDN package 302 compared to a BS-PDN package 304 that uses a bonding layer of conventional oxide material. The thermal resistance delta 306 between the packages indicates that the BS-PDN package 304 has an approximately 20% increase (e.g., approximately 19%, etc.) in thermal resistance over the FS-PDN package 302. The substantial increase in thermal resistance dramatically impacts the useability of the BS-PDN package over the FS-PDN package. The difference in thermal resistance makes the BS-PDN package a much less attractive design, despite the BS-PDN's advantages.

Figure 4:
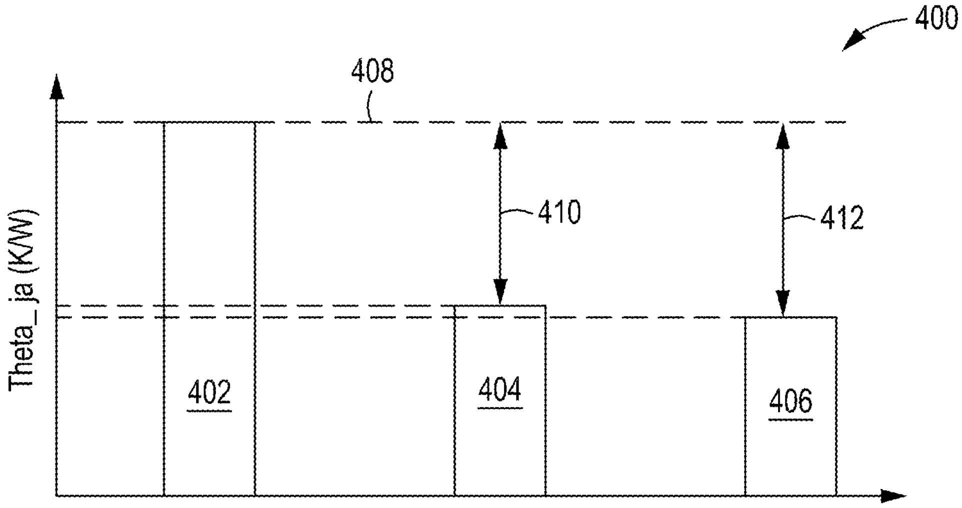
FIG. 4 depicts a graph of thermal resistance comparisons between a BS-PDN with conventional oxide bonding layer, a BS-PDN with c-BN bonding layer, and a BS-PDN with isotope enriched c-BN bonding layer in accordance with some embodiments of the present principles.

To enhance the useability of the BS-PDN packages, the inventors were able to substantially reduce the difference in thermal resistance by using c-BN-based materials for the bonding layer as depicted in a graph 400 of FIG. 4. Using a BS-PDN package 402 with conventional oxide bonding layer as a baseline 408, a BS-PDN package 404 with a c-BN bonding layer provided a reduced thermal resistance 410 of approximately 9% and a BS-PDN package 406 with a isotope enriched c-BN bonding layer provided a reduced thermal resistance 412 of approximately 9.5%. Doping c-BN with heavy isotopes such as B-10 and/or B-11 using ion implantation decreases thermal resistance but adds to the complexity of the bonding layer formation and yields less than a 1% overall difference in thermal dissipation. For high performance packages (e.g., supercomputing applications, etc.), isotope enriched c-BN may be beneficial despite the complexity/cost factors. The cubic boron nitride bonding layer may be formed using any compatible methods such as ion beam-assisted molecular-beam epitaxy (MBE), low pressure plasma enhanced chemical vapor deposition (LP-PECVD), laser deposition methods, and reactive sputter deposition methods, and the like. The isotope enriched cubic boron nitride bonding layer may be formed by first depositing the c-BN layer followed by enriching the c-BN with isotopes B-10 or B-11 with ion implantation or by enriching the c-BN with isotopes B-10 or B-11 during deposition of the c-BN layer. In ion implantation processes requiring annealing, the non-enriched c-BN deposition process may be preferred due to device thermal budget reasons. Naturally occurring c-BN contains approximately 22% of B-10 isotopes and approximately 78% of B-11 isotopes. In some embodiments, the high thermal conductivity of approximately 1600 W/m*K is achieved by increasing the B-10 or B-11 isotopes of boron to approximately 99%.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for forming a structure with a backside power delivery network (BS-PDN), comprising:

forming a first layer stack that includes, at least, a front side metallization (FSM) signal layer formed on a silicon die layer containing nano-through silicon vias (n-TSVs) that is formed on a back side metallization (BSM) power distribution layer, wherein the n-TSVs provide back side power connections to the FSM signal layer;

forming a second layer stack that includes, at least, a silicon carrier layer; and forming a third layer stack that includes the first layer stack and the second layer stack bonded together with a bonding layer interposed between the first layer stack and the second layer stack, wherein the bonding layer is formed of a cubic-boron nitride-based material.

2. The method of claim 1, wherein the cubic-boron nitride-based material is a cubic-boron nitride material enriched with B-10 or B-11 isotopes using a process to obtain a B-10 or B-11 isotope percentage of approximately 99%.

3. The method of claim 1, wherein the silicon die layer has a thickness of approximately 200 nm to approximately 300 nm.

4. The method of claim 1, wherein the n-TSVs have a diameter of approximately 100 nm.

5. The method of claim 1, wherein the bonding layer has a thickness of approximately 250 nm to approximately 1.2 microns.

6. The method of claim 5, wherein the bonding layer has a thickness of approximately 1.0 micron.

7. The method of claim 1, wherein the second layer stack includes a thermal interface material (TIM) layer formed on the silicon carrier layer and a heat sink layer formed on the TIM layer.

8. The method of claim 7, wherein the heat sink layer is formed of copper.

9. The method of claim 1, wherein the first layer stack is a device wafer.

10. The method of claim 1, wherein the first layer stack further includes the BSM layer formed on a controlled collapse of chip connection (C4) layer and the C4 layer formed on a substrate.

11. A method for forming a structure with a backside power delivery network, comprising:

forming a first layer stack that includes, at least, a front side metallization (FSM) signal layer formed on a silicon die layer containing nano-through silicon vias (n-TSVs) that is formed on a back side metallization (BSM) power distribution layer, wherein the n-TSVs provide back side power connections to the FSM signal layer and have a diameter of approximately 100 nm;

forming a second layer stack that includes, at least, a silicon carrier layer; and forming a third layer stack that includes the first layer stack and the second layer stack bonded together with a bonding layer interposed between the first layer stack and the second layer stack, wherein the bonding layer is formed of a cubic-boron nitride-based material and has a thickness of approximately 250 nm to approximately 1.2 microns.

12. The method of claim 11, wherein the cubic-boron nitride-based material is a cubic-boron nitride material enriched with B-10 or B-11 isotopes using a process to obtain a B-10 or B-11 isotope percentage of approximately 99%.

13. The method of claim 11, wherein the silicon die layer has a thickness of approximately 200 nm to approximately 300 nm.

14. The method of claim 11, wherein the bonding layer has a thickness of approximately 1.0 micron.

15. The method of claim 11, wherein the second layer stack includes a thermal interface material (TIM) layer formed on the silicon carrier layer and a heat sink layer formed on the TIM layer.

16. The method of claim 15, wherein the heat sink layer is formed of copper.

17. The method of claim 11, wherein the first layer stack is a device wafer.

18. The method of claim 11, wherein the first layer stack further includes the BSM layer formed on a controlled collapse of chip connection (C4) layer and the C4 layer formed on a substrate.

19. A non-transitory, computer readable medium having instructions stored thereon that, when executed, cause a method for forming a structure with a backside power delivery network to be performed, the method comprising:

forming a first layer stack that includes, at least, a front side metallization (FSM) signal layer formed on a silicon die layer containing nano-through silicon vias (n-TSVs) that is formed on a back side metallization (BSM) power distribution layer, wherein the n-TSVs provide back side power connections to the FSM signal layer;

forming a second layer stack that includes, at least, a silicon carrier layer; and forming a third layer stack that includes the first layer stack and the second layer stack bonded together with a bonding layer interposed between the first layer stack and the second layer stack, wherein the bonding layer is formed of a cubic-boron nitride-based material.

20. The non-transitory, computer readable medium of claim 19, the method further comprising at least one of a, b, c, d, or e:

a) wherein the cubic-boron nitride-based material is a cubic-boron nitride material enriched with B-10 or B-11 isotopes using a process to obtain a B-10 or B-11 isotope percentage of approximately 99%;

b) wherein the silicon die layer has a thickness of approximately 200 nm to approximately 300 nm;

c) wherein the n-TSVs have a diameter of approximately 100 nm;

d) wherein the bonding layer has a thickness of approximately 250 nm to approximately 1.2 microns; or e) wherein the bonding layer has a thickness of approximately 1.0 micron.

* * * * *